US009161396B2

(12) United States Patent
Hikmet et al.

(10) Patent No.: US 9,161,396 B2
(45) Date of Patent: Oct. 13, 2015

(54) LIGHT-EMITTING ARRANGEMENT

(75) Inventors: Rifat Ata Mustafa Hikmet, Eindhoven (NL); Johannes Franciscus Maria Cillessen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/825,694

(22) PCT Filed: Sep. 19, 2011

(86) PCT No.: PCT/IB2011/054083

§ 371 (c)(1),
(2), (4) Date: Mar. 22, 2013

(87) PCT Pub. No.: WO2012/042428

PCT Pub. Date: Apr. 5, 2012

(65) Prior Publication Data

US 2013/0175920 A1 Jul. 11, 2013

(30) Foreign Application Priority Data

Sep. 28, 2010 (EP) .................................... 10181075

(51) Int. Cl.
*H05B 33/04* (2006.01)
*H01L 51/52* (2006.01)
*F21V 31/00* (2006.01)
(Continued)

(52) U.S. Cl.
CPC ................ *H05B 33/04* (2013.01); *F21K 9/135* (2013.01); *F21K 9/56* (2013.01); *F21V 31/00* (2013.01); *H01L 51/5259* (2013.01); *H05B 33/14* (2013.01); *F21V 31/03* (2013.01); *F21Y 2101/02* (2013.01)

(58) Field of Classification Search
CPC ............................ H05B 33/04; H01L 51/5259
USPC .......... 252/181.1, 181.3, 181.4, 181.6, 181.7; 313/512, 501, 504, 553, 55
See application file for complete search history.

(56) References Cited

U.S. PATENT DOCUMENTS 4,127,503 A * 11/1978 Yoshikawa et al. ........... 502/401
4,891,542 A 1/1990 Mellor
(Continued)

FOREIGN PATENT DOCUMENTS

WO WO2005016762 A2 2/2005
WO WO 2009080586 A2 * 7/2009
WO WO2012001645 A1 1/2012

*Primary Examiner* — Anh Mai
*Assistant Examiner* — Steven Horikoshi
(74) *Attorney, Agent, or Firm* — Yuliya Mathis

(57) ABSTRACT

The invention provides a light-emitting arrangement (100, 200, 300), comprising: a light source (101, 201, 301) adapted to emit light of a first wavelength; a wavelength converting member (106, 206, 306) comprising a wavelength converting material adapted to receive light of said first wavelength and to convert at least part of the received light to light of a second wavelength; a sealing structure (103) at least partially surrounding said wavelength converting member to form a sealed cavity (105, 205, 305) containing at least said wavelength converting member, said cavity containing a controlled atmosphere; and a getter material (108, 208, 308) arranged within said sealed cavity, wherein said getter material is adapted to operate in the presence of water and/or produces water as a reaction product. Such getter materials have high capacity for removal of oxygen from the atmosphere within the sealed cavity, such that a low oxygen concentration can be maintained within the cavity. Hence, the lifetime of the wavelength converting material may be prolonged.

13 Claims, 3 Drawing Sheets

(51) Int. Cl.

| | |
|---|---|
| ***H05B 33/14*** | (2006.01) |
| ***F21K 99/00*** | (2010.01) |
| *F21V 31/03* | (2006.01) |
| *F21Y 101/02* | (2006.01) |

(56) References Cited

U.S. PATENT DOCUMENTS

| | | | | |
|---|---|---|---|---|
| 4,992,410 | A | 2/1991 | Cullen | |
| 5,744,056 | A | 4/1998 | Venkateshwaran | |
| 6,133,361 | A * | 10/2000 | Hatakeyama et al. | 206/524 |
| 6,833,668 | B1 * | 12/2004 | Yamada et al. | 313/505 |
| 7,465,963 | B2 | 12/2008 | Hauashi | |
| 7,553,582 | B2 | 6/2009 | Bates | |
| 7,560,820 | B2 | 7/2009 | Amiotti | |
| 7,572,478 | B2 | 8/2009 | Ogura | |
| 2005/0052125 | A1 | 3/2005 | Moriyama et al. | |
| 2005/0062174 | A1 * | 3/2005 | Ingle | 257/788 |
| 2007/0184300 | A1 * | 8/2007 | Yokose et al. | 428/690 |
| 2007/0273274 | A1 * | 11/2007 | Horiuchi et al. | 313/504 |
| 2010/0164346 | A1 * | 7/2010 | Li et al. | 313/46 |

* cited by examiner

LIGHT-EMITTING ARRANGEMENT

FIELD OF THE INVENTION

The present invention related to light-emitting arrangements containing wavelength converting compounds which require a controlled atmosphere.

BACKGROUND OF THE INVENTION

Light-emitting diode (LED) based illumination devices are increasingly used for a wide variety of lighting applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting materials. To produce an LED based illumination device having a desired color (e.g., white) output, a suitable wavelength converting material, commonly known as a phosphor, may be used which converts part of the light emitted by the LED into light of longer wavelengths so as to produce a combination of light having desired spectral characteristics. The wavelength converting material may be applied directly on the LED die, or it may be arranged at a certain distance from the phosphor (so-called remote configuration). For example, the phosphor may be applied on the inside of a sealing structure encapsulating the device.

Many inorganic materials have been used as phosphor materials for converting blue light emitted by the LED into light of longer wavelengths. However, inorganic phosphors suffer from the disadvantages that they are relatively expensive. Furthermore, inorganic LED phosphors are light scattering particles, thus always reflecting a part of the incoming light, which leads to loss of efficiency in a device. Furthermore, inorganic LED phosphors have limited quantum efficiency and a relatively broad emission spectrum, in particular for the red emitting phosphors, resulting in additional efficiency losses.

Currently, organic phosphor materials are being considered for replacing inorganic phosphors in LEDs where conversion of blue light into light of the green to red wavelength range is desirable, for example for achieving white light output. Organic phosphors have the advantage that their luminescence spectrum can be easily adjusted with respect to position and band width. Organic phosphor materials also often have a high degree of transparency, which is advantageous since the efficiency of the lighting system is improved compared to systems using more light-absorbing and/or reflecting phosphor materials. Furthermore, organic phosphors are much less costly than inorganic phosphors. However, since organic phosphors are sensitive to the heat generated during electroluminescence activity of the LED, organic phosphors are primarily used in remote configuration devices.

Another drawback hampering the application of organic phosphor materials in LED based lighting systems is their photo-chemical stability, which is poor. Organic phosphors have been observed to degrade quickly when illuminated with blue light in the presence of oxygen.

Efforts have been made to solve this problem. U.S. Pat. No. 7,560,820 discloses a light emitting diode (LED) comprising a closed structure which encloses a cavity with a controlled atmosphere. In the cavity there are arranged an emitter element, a phosphor arranged close to the emitter element, and a getter. However, the getters used in the device of U.S. Pat. No. 7,560,820 have relatively low capacity for oxygen gettering and also require activation before assembly of the device. Furthermore, these getters are negatively affected by the presence of moisture, since in the absence of oxygen these getters react with moisture and as a result becomes insensitive to oxygen which may later penetrate into the device.

SUMMARY OF THE INVENTION

It is an object of the present invention to at least partly overcome the problems of the prior art, and to provide a light-emitting arrangement with improved control of the environment around the organic phosphor.

It is also an object of the invention to provide a light-emitting arrangement comprising an organic phosphor, in which the life time of the organic phosphor is increased.

According to a first aspect of the invention, these and other objects are achieved by a light-emitting arrangement comprising: a light source adapted to emit light of a first wavelength, a wavelength converting member comprising a wavelength converting material adapted to receive light of said first wavelength and to convert at least part of the received light to light of a second wavelength, and a sealing structure at least partially surrounding said wavelength converting member to form a sealed cavity containing at least said wavelength converting member. The cavity contains a controlled atmosphere. The light-emitting arrangement further comprises a getter material arranged within the sealed cavity, which getter material is adapted to operate in the presence of water and/or produces water as a reaction product. Typically, the getter is adapted to remove oxygen from the controlled atmosphere within the cavity. The wavelength converting material preferably comprises at least one organic wavelength converting compound.

The present inventors have found that getters which operate in the presence of water and/or which produce water as a reaction product have high capacity for removal of oxygen, such that a controlled atmosphere having a low oxygen content can be maintained within the cavity. Hence, the lifetime of the wavelength converting material may be prolonged. With the light-emitting arrangement according to the invention, a low oxygen content can be achieved in a large volume cavity, and/or where a permeable seal is used allowing relatively high rate of diffusion of oxygen into the cavity. Also, release of oxygen from components inside the cavity, e.g. from a phosphor matrix or carrier material, may be acceptable.

According to embodiments of the invention, the getter comprises particles comprising an oxidizable metal, such as iron, and at least one protic solvent hydrolyzable halogen compound and/or an adduct thereof. The protic solvent hydrolyzable halogen compound and/or adduct thereof may be deposited upon the particles comprising the oxidizable metal. In such embodiments, the protic solvent hydrolyzable halogen compound and/or adduct thereof may have been deposited from an essentially moisture free liquid.

The halogen compound may be selected from the group consisting of sodium chloride ($NaCl$), titanium tetrachloride ($TiCl_4$), tin tetrachloride ($SnCl_4$), thionyl chloride ($SOCl_2$), silicon tetrachloride ($SiCl_4$), phosphoryl chloride ($POCl_3$), n-butyl tin chloride, aluminium chloride ($AlCl_3$), aluminium bromide ($AlBr_3$), iron(III)chloride, iron(II)chloride, iron(II) bromide, antimony trichloride ($SbCl_3$), antimony pentachloride ($SbCl_5$), and aluminium halide oxide. These materials have high capacity for oxygen removal from the surrounding atmosphere.

According to embodiments of the invention, the getter may comprise an oxidizable metal, such as iron, and an electrolyte.

The electrolyte typically comprises sodium chloride. Such getter materials also have high capacity for oxygen removal from the surrounding atmosphere.

According to embodiments of the invention, the getter material further comprise a water-containing agent. In particular where the getter requires moisture in order to provide high capacity oxygen removal, it may be advantageous to include a water-containing agent which provides water for the reaction of the getter material with oxygen. In this way, high performance of the getter can be ensured even if the sealed cavity otherwise does not contain water at all or does not contain a sufficient amount of water. Optionally, in these embodiments, the getter material may further comprise a non-electrolytic acidifying component.

According to embodiments of the invention the sealing structure is non-hermetic and permeable to oxygen. Typically, the sealing structure comprises a seal for sealing the cavity, which seal may be non-hermetic and permeable to oxygen, while the rest of the sealing structure is non-permeable. A non-hermetic sealing is advantageous since it may be easier to achieve than a hermetic sealing, and there is also more freedom of choice with respect to materials and device design.

According to embodiments of the invention the light source may comprise at least one LED, and preferably at least one inorganic LED.

According to embodiments of the invention the wavelength converting member and the light source are mutually spaced apart, i.e. the wavelength converting member is arranged as a remote phosphor. Using such an arrangement the phosphor is less exposed to the heat generated by the light source, in particular where the light source comprises one or more LEDs.

According to a further embodiment of the invention, the sealing structure may also enclose the light source. The light source may thus also be arranged within said sealed cavity, as well as the wavelength converting member.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
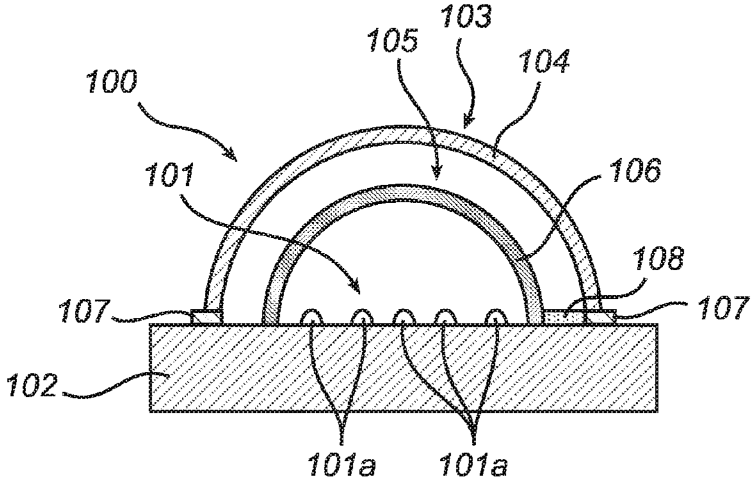
FIG. 1 is a cross-sectional view of an embodiment of a light emitting arrangement according to the present invention.

In FIG. 1 an embodiment of the light emitting arrangement 100 is shown in a cross-sectional view and seen from the side. The light emitting arrangement 100 comprises a sealing structure 103, which encloses a cavity 105, and which comprises a base part 102 and a light outlet member 104. Within the cavity, attached to the base part 102, is arranged a light source 101 comprising a plurality of LEDs 101*a*. The light outlet member 104 is attached to the base part 102 by means of a seal 107 arranged to seal the cavity 105. The arrangement 100 further comprises a remote wavelength converting member 106, which is attached to the base part 102 in the cavity 105 and arranged to receive light emitted by the LEDs. A getter 108 is arranged on the base part 102 within the cavity 105. The base part 102 further comprises or supports for instance electrical terminals and drive electronics, as understood by the person skilled in the art, although not explicitly shown.

The wavelength converting member 106 comprises a wavelength converting material, also called a phosphor. Typically the wavelength converting member comprises an organic phosphor, which has many advantages compared to traditional inorganic phosphors. However, certain gases, typically oxygen, may cause undesirably fast degradation of organic phosphors. Therefore, commonly a hermetic seal and vacuum or an inert gas in the cavity has been used in order to avoid reaction of the phosphor with oxygen and thus prolong the life time of the phosphor. Another solution which has been used, is to integrate the phosphor material with the LED element. However, when manufacturing different kinds of lamps having different shapes and light properties it is advantageous to arrange the phosphor as a remote element. In addition, it has been found that the phosphor material degradation is slower when the phosphor is applied remote instead of integrated with the LED element, because of the lower temperature, and the blue light flux density. However, the remote phosphor configuration in particular requires controlling the amount of reactive gas, such as oxygen, within the cavity 105. Oxygen may be present in the cavity 105 as a result of sealing the device under an oxygen-containing atmosphere, and/or it may enter the cavity 105 via a permeable seal, and/or it may be released or produced from a material within the cavity 105, e.g. a matrix material of the wavelength converting member 106, during operation of the light-emitting arrangement.

Hermetic sealing under vacuum or an inert atmosphere is relatively difficult and costly. The solution according to the present invention provides for a simpler structure, although in its most general concept, it does not exclude hermetic sealing.

The getter 108 of the light emitting arrangement according to the invention is capable of absorbing a gas which is present in the cavity. In particular, the getter is arranged to absorb a gas, especially oxygen gas, that would be detrimental to the organic phosphor material of the wavelength converting element 106. With this structure of the LED device 100 it is possible to provide a non-hermetic seal, i.e. a permeable seal.

Referring again to FIG. 1, the seal 107 extends along the rim of the light outlet member 104, which in this embodiment is a dome. It should be noted that throughout this application the light outlet member comprises one or more walls, which is/are made of a light passing material, e.g. glass or an appropriate plastic or a barrier film, as understood by the person skilled in the art. The getter 108 is arranged adjacent to the seal 107. The position is chosen inter alia in order to avoid that the getter 108 interferes with an output light path, i.e. the light that is output from the light emitting arrangement 100. The getter can be placed behind a reflector. The getter itself can also be made reflective.

A permeable seal is typically an organic adhesive, such as an epoxy adhesive. It should be noted that indeed the permeability is kept low, while still avoiding the additional cost of providing a seal that guarantees a hermetic seal for a long time.

Preferably, the cavity 105 is filled with an oxygen free atmosphere containing one or more inert gases, such as argon, neon, nitrogen, and/or helium.

Still referring to the embodiment shown in FIG. 1, the remote wavelength converting member 106 is formed like a dome shaped hood, as is the light outlet member 104, and the oxygen free atmosphere is filled in the whole cavity, i.e. both between the wavelength converting member 106 and the base part 102 and between the wavelength converting member 106 and the light outlet member 104. Furthermore, the getter 108 is arranged between the wavelength converting member 106 and the light outlet member 104.

Preferably, the LEDs 101*a* are blue light emitting LEDs, and the remote wavelength converting member 106 is arranged to convert part of the blue light into light of longer wavelength, e.g. yellow, orange and/or red light, so as to provide white light output from the light-emitting arrangement 100.

What has been described so far regarding the properties of the controlled atmosphere, the getter, the seal, and the remote organic phosphor element is in general true for all embodiments, unless nothing else is explicitly or implicitly stated.

Typically the getter 108 is an oxygen getter, meaning a material which absorbs or reacts with oxygen, thus removing oxygen from the atmosphere within the cavity 105.

The present inventors have surprisingly found that the presence of water does not adversely affect the lifetime of an organic phosphor, and thus that a getter which operates in the presence of water and/or which produces water as a reaction product during oxygen gettering, may be used in a light-emitting arrangement as described herein. As used herein, "water" is intended to encompass water both in the gas phase (also referred to as moisture or humidity) and in the liquid phase.

Figure 4:
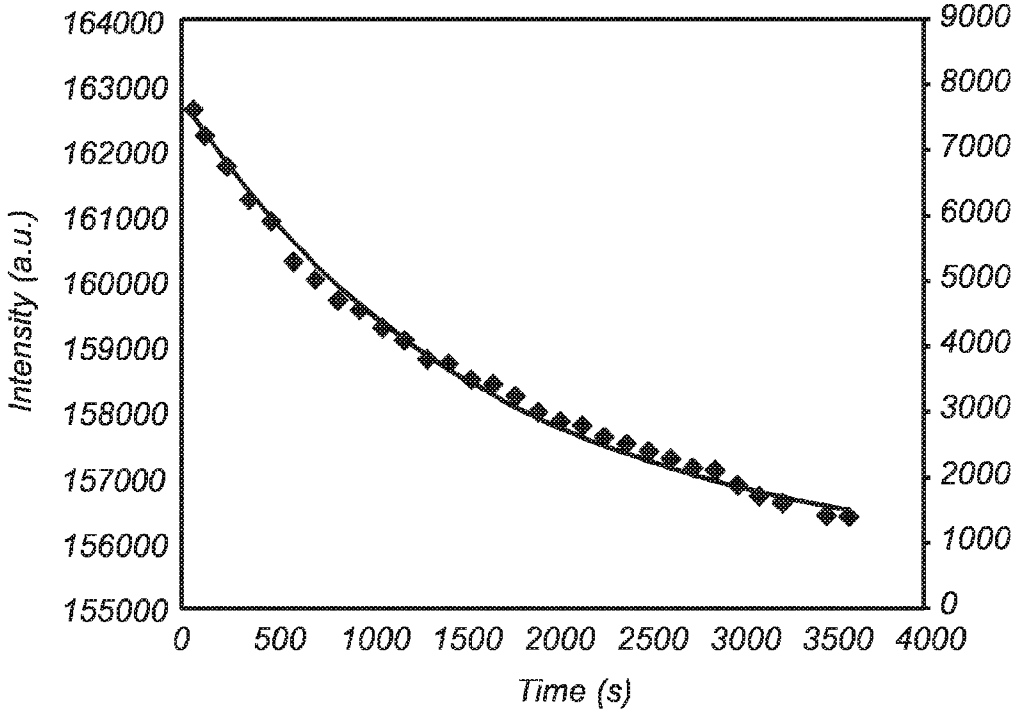
FIG. 4 is a graph showing the degradation of an organic phosphor as a function of time.

FIG. 4 is a graph showing as a function of time the intensity of light emitted from a layer containing 0.1% by weight of the commercial organic phosphor Lumogen® Red F-305 dye (available from BASF) in a poly(methyl methacrylate) (PMMA) matrix illuminated by a laser emitting light of 450 nm with a flux density of 4.2 W/cm$^2$. Due to degradation of the F-305 phosphor under blue light irradiation, the emission intensity of the F-305 phosphor decreases with time. The initial absorption by the dye in the layer was chosen to be 10% and thus the intensity decrease could be directly related to the concentration of phosphor molecules that had degraded (no longer emitting light). It can be seen that the change in light intensity is an exponential function of time, $c(t)=c(0)*e^{-kt}$, with a decay constant k corresponding to the degradation rate of the organic phosphor compound.

Figure 5:
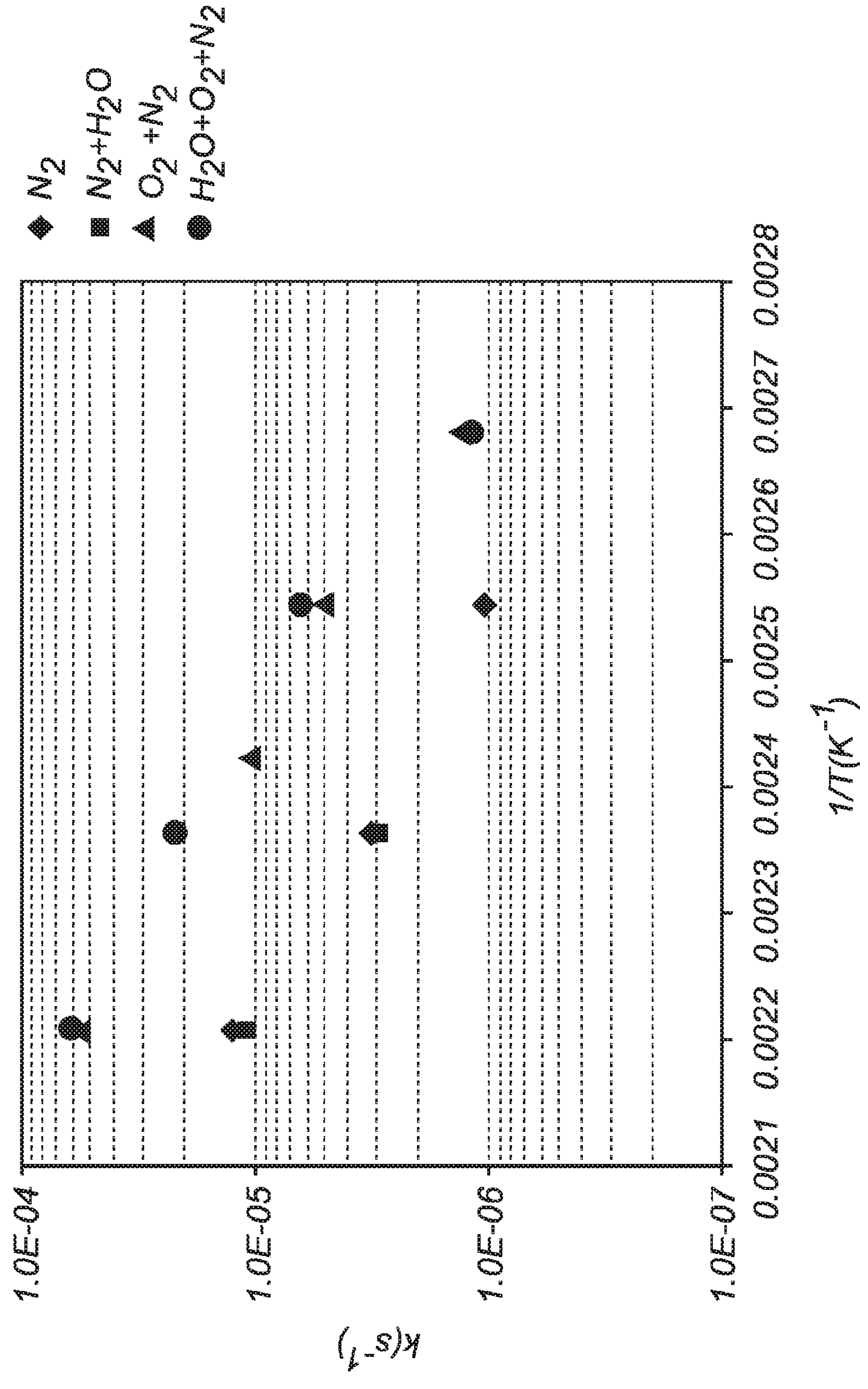
FIG. 5 is a graph showing the effect of moisture on the lifetime of an organic phosphor.

Furthermore, the decay rate k of the red-emitting organic phosphor (Lumogen® Red F-305, available from BASF) in a PMMA matrix under different atmospheric conditions was investigated. The phosphor (0.1% by weight in PMMA) was illuminated with blue light at a light flux intensity 4.2 W/cm$^2$ at various temperatures under the following atmospheres: a) dry air ($N_2$+$O_2$); b) air containing 2.5% water ($N_2$+$O_2$+$H_2O$); c) dry nitrogen gas ($N_2$); and d) nitrogen gas containing 2.5% water ($N_2$+$H_2O$). The results are presented in FIG. 5, which is a graph illustrating the decay rate k as a function of inverse temperature (1/T). As can be seen in this figure, the decay rate of the phosphor in wet nitrogen gas ($N_2$+$H_2O$) is substantially the same as the decay rate in pure, dry nitrogen ($N_2$). It can also be seen that the decay rate in air containing 2.5% water ($N_2$+$O_2$+$H_2O$) did not substantially differ from the decay rate in dry air ($N_2$+$O_2$). Thus, it was concluded that the presence of moisture does not negatively affect the decay rate of the phosphor.

Hence, a getter which operates in the presence of water and/or which produces water as a chemical reaction product may be used in a light-emitting arrangement according to the invention. This is advantageous because many oxygen getters which work in the presence of water and/or produce water as a product of reaction with oxygen have high capacity for oxygen gettering and thus are very efficient. Using such a getter in the sealed cavity of the light-emitting arrangement according to the invention may reduce the oxygen concentration to about 0.01%. Hence, according to the present invention, a low oxygen content can be achieved in a large volume cavity and/or when an at least partially permeable seal is used which provides a relatively high diffusion rate for oxygen into the cavity.

The present getters can be brought into the light-emitting arrangement of the invention under normal atmospheric conditions with respect to oxygen content, for example in air. The getters described herein react with oxygen relatively slowly. Advantageously, the getters do not require an activation step.

In embodiments of the invention, the getter may be a particulate material, applied in or on a permeable carrier material, e.g. contained in a permeable patch, or applied on an inner surface of the sealing structure for example as a coating.

The getter may comprise oxidizable metal particles, such as particles of iron, zinc, copper aluminium and/or tin. Further, the getter may comprise an electrolyte, such as sodium chloride. This composition may also contain non-electrolytic acidifying component such as sodium acid pyrophosphate as described in U.S. Pat. Nos. 5,744 056 or 4,992,410.

Alternatively, the getter may comprise a material whose reaction with oxygen requires or is promoted by the presence of water. Such a getter may comprise oxidizable particles comprising i) an oxidizable metal, and ii) at least one protic solvent hydrolyzable halogen compound and/or an adduct thereof. The protic solvent hydrolyzable halogen compound and/or adduct thereof is typically deposited on the oxidizable metal from an essentially moisture free liquid as described in WO2005/016762.

The getter may comprise a halogen compound which is hydrolyzable in a protic solvent, chlorine and bromine being preferred halogens. Examples of such halogen compounds include titanium tetrachloride ($TiCl_4$), tin tetrachloride ($SnCl_4$), thionyl chloride ($SOCl_2$), silicon tetrachloride ($SiCl_4$), phosphoryl chloride ($POCl_3$), n-butyl tin chloride, aluminium chloride ($AlCl_3$), aluminium bromide ($AlBr_3$), iron(III)chloride, iron(II)chloride, iron(II)bromide, antimony trichloride ($SbCl_3$), antimony pentachloride ($SbCl_5$) and aluminium halide oxide.

When the getter comprises a material which requires the presence of water in order to react with oxygen, or whose reaction with oxygen is promoted by the presence of water, a water-containing material such as silica gel may optionally be included in the getter and/or arranged within the sealed cavity together with the getter, in order to ensure that the there is enough water present for the getter to function as intended within the sealed cavity.

The controlled atmosphere within the sealed cavity may be a non-condensing atmosphere having a relative humidity equal to or lower than 100%. The relative humidity is preferably less than 100%, and more preferably 50% or less. The water content within the sealed cavity may be about 10% by weight, corresponding to a relative humidity of 100% at 50° C. in air at atmospheric pressure. Preferably, the water content within the cavity may be about 3% by weight, corresponding to a relative humidity of 100% at 30° C. in air at atmospheric pressure. More preferably, the water content within the sealed cavity may be about 1.5% by weight, corresponding to a relative humidity of 100% at 20° C. in air at atmospheric pressure. The water content may thus be in the range of from 1.5% to 10% by weight. However, the controlled atmosphere may also have a water content of below 1.5%, in particular when a water-containing material is included in the getter.

Figure 2:
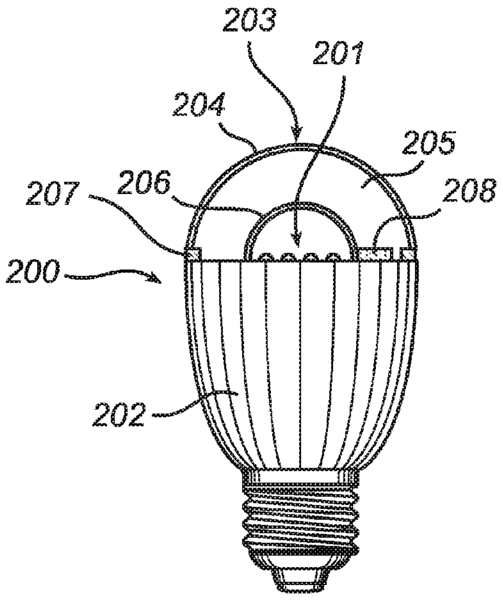
FIGS. 2 and 3 are cut away side views of further embodiments of a light emitting arrangement according to the present invention.
Figure 3:
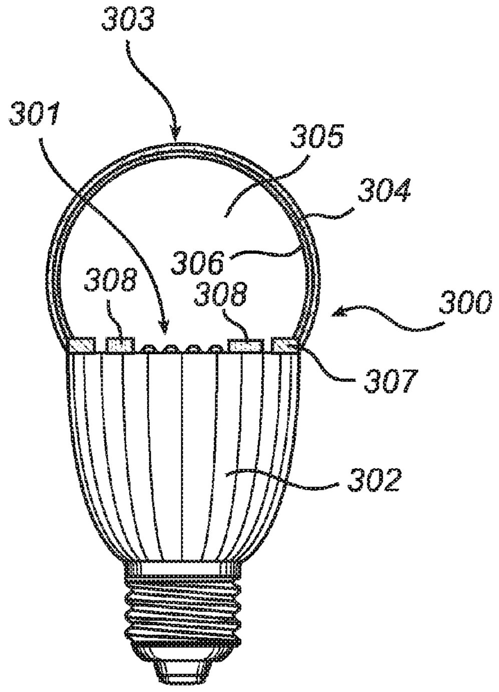

Referring to FIGS. 2 and 3, in further embodiments the light-emitting arrangement is provided as a retrofit lamp. The light-emitting arrangement 200, 300 has a base part 202, 302, which is provided with a traditional cap such as an Edison screw cap or a bayonet cap. Further, the LED device 200, 300 has a bulb shaped light outlet member 204, 304 enclosing the cavity 205, 305. In one embodiment, see FIG. 2, the remote wavelength converting member 206 is arranged as a separate hood shaped part inside the light outlet member 204. The remote wavelength converting member 206 covers the light source 201 at a distance from the light outlet member 204. The getter 208 is arranged between the remote wavelength converting member 206 and the light outlet member 204, adjacent to the seal 207. Thereby the getter 208 does not interfere with the output light path. In the other embodiment, see FIG. 3, the remote wavelength converting member 306 is arranged as a coating on the inside of the light outlet member 304, the getter 308 being thus positioned inside of the wavelength converting member 306, and close to the seal 307.

The person skilled in the art realizes that the present invention by no means is limited to the preferred embodiments described above. On the contrary, many modifications and variations are possible within the scope of the appended claims. For example, the wavelength converting member may be contained in a first sealed cavity containing a controlled atmosphere as described herein, while the light source is not contained within the same cavity, but within a second cavity, which may contain a controlled atmosphere which may be similar to or different from the controlled atmosphere of the first cavity. Alternatively, the light source may not be contained within any such cavity at all.

The invention claimed is:

1. A light-emitting arrangement comprising:

a light source adapted to emit light of a first wavelength;

a wavelength converting member comprising a wavelength converting material adapted to receive light of said first wavelength and to convert at least part of the received light to light of a second wavelength;

a sealing structure at least partially surrounding said wavelength converting member to form a sealed cavity containing at least said wavelength converting member, said cavity containing a controlled atmosphere in which water content is in a range of about 1.5% to about 10% by weight; and a getter material arranged within said sealed cavity, wherein said getter material comprises a material whose reaction with oxygen requires or is promoted by the presence of water, and/or produces water as a reaction product.

2. The light-emitting arrangement according to claim 1, wherein said water content is in a range of about 3% to about 10% by weight.

3. The light-emitting arrangement according to claim 1, wherein said water content is about 10% by weight.

4. The light-emitting arrangement according to claim 1, wherein said material whose reaction with oxygen requires or is promoted by the presence of water, and/or produces water as a reaction product, includes particles comprising an oxidizable metal, and at least one protic solvent hydrolyzable halogen compound and/or an adduct thereof.

5. A light-emitting arrangement according to claim 1, wherein said getter material is composed of an oxidizable metal and an electrolyte.

6. A light-emitting arrangement according to claim 5, wherein the electrolyte comprises sodium chloride.

7. A light-emitting arrangement according to claim 5, wherein said getter material further comprises a non-electrolytic acidifying component.

8. A light-emitting arrangement according to claim 1, wherein the sealing structure comprises a seal sealing the cavity, which seal is non-hermetic and permeable to oxygen.

9. A light-emitting arrangement according to claim 1, wherein said wavelength converting member and said light source are mutually spaced apart.

10. A light-emitting arrangement according to claim 1, wherein said wavelength converting material comprises an organic wavelength converting compound.

11. A light-emitting arrangement according to claim 1, wherein said light source comprises at least one LED.

12. A light-emitting arrangement according to claim 11, wherein said at least one LED is an inorganic LED.

13. A light-emitting arrangement according to claim 1, wherein said getter material is arranged to remove oxygen from the controlled atmosphere within the cavity.

* * * * *